United States Patent

Kim

[11] Patent Number: 5,877,549
[45] Date of Patent: Mar. 2, 1999

[54] UFBGA PACKAGE EQUIPPED WITH INTERFACE ASSEMBLY INCLUDING A PHOTOSOLUBLE LAYER

[75] Inventor: Jin Sung Kim, Choongchungbook-Do, Rep. of Korea

[73] Assignee: LG Semicon Co., Ltd., Cheongju, Rep. of Korea

[21] Appl. No.: 581,956

[22] Filed: Jan. 2, 1996

[30] Foreign Application Priority Data

Oct. 19, 1995 [KR] Rep. of Korea ................. 1995-36163

[51] Int. Cl.⁶ .................................................. H01L 23/48
[52] U.S. Cl. ......................... 257/693; 257/678; 257/690
[58] Field of Search .................... 257/693, 697, 257/738, 778, 780, 786, 690

[56] References Cited

U.S. PATENT DOCUMENTS

| | | | |
|---|---|---|---|
| 4,731,282 | 3/1988 | Tsukagoshi et al. | 428/220 |
| 5,042,919 | 8/1991 | Yabu et al. | 359/88 |
| 5,072,289 | 12/1991 | Sugimoto et al. | 357/68 |
| 5,120,665 | 6/1992 | Tsukagoshi et al. | 437/8 |
| 5,283,468 | 2/1994 | Kondo et al. | 257/774 |
| 5,291,062 | 3/1994 | Higgins, III | 257/698 |
| 5,302,854 | 4/1994 | Nishigurhi et al. | 257/737 |
| 5,434,452 | 7/1995 | Higgins, III | 257/773 |

OTHER PUBLICATIONS

Nekkei Electronics Magazine, May 1994, pp. 42–45.

*Primary Examiner*—Olik Chaudhuri
*Assistant Examiner*—Nathan K. Kelly
*Attorney, Agent, or Firm*—Fleshner & Kim

[57] ABSTRACT

An improved UFBGA package equipped with an interface assembly having external electrode protrusions, an anisotropic conductive film, and a photosoluble film, which includes an interface assembly provided at the lower portion of the substrate.

12 Claims, 2 Drawing Sheets

UFBGA PACKAGE EQUIPPED WITH INTERFACE ASSEMBLY INCLUDING A PHOTOSOLUBLE LAYER

BACKGROUND OF THE INVENTION

1. Field of the Invention

The present invention relates to a UFBGA (ultra fine pitch ball grid array) package equipped with an interface assembly, and particularly to an improved UFBGA package equipped with an interface assembly having external electrode protrusions, an anisotropic conductive film, and a photosoluble film.

2. Description of the Conventional Art

A conventional BGA (ball grid arrays) package is well known to those who skilled in the art. In particular, the BGA package is well disclosed in the magazine NEKKEI Electronics of May, 1994 at pages 42 thorough 45. The BGA package, as shown in FIG. 1, includes a semiconductor chip 3 disposed at a central portion of a substrate 1 and bonded by an epoxy adhesive 2. In addition, pads (not shows) of the semiconductor chip 3 and a conductive pattern (not shown) formed on the substrate are electrically connected with a wire 4. In addition, solder balls 6 are bonded to an external terminal 5 formed on the lower surface of the substrate 1.

Meanwhile, after connecting the wire 4 and molding the BGA package with an epoxy molding compound (EMC), a plurality of spaced-apart solder balls 6 are aligned at the lower surface of the substrate 1 and is processes in a reflow method, so that the solder balls 6 are bonded.

However, the reliability of the BGA package made through the above-mentioned processes is completely dependent on the soldering process. When inferior product occurs during an electric test, in a state that the temperature is increased, since the entire BGA package should be changed, it is difficult to effectively maintain the system.

Moreover, in the BGA package, when solder balls are not well bonded to the printed circuit board, the impedance value is sharply increased in an external electric test. In this case, even part of the solder balls is inferior it is necessary to melt the entire solder balls and to substitute with a new BGA package after a cleaning process, so that when error package is found, the entire process should be changed.

SUMMARY OF THE INVENTION

Accordingly, it is an object of the present invention to provide a UFBGA package equipped with an interface assembly, which overcome the problems encountered in a conventional UFBGA package equipped with an interface assembly.

It is another object of the present invention to provide an improved UFBGA package equipped with an interface assembly having external electrode protrusions, an anisotropic conductive film, and a photosoluble film.

To achieve the above objects, there is provided a UFBGA package equipped with an interface assembly, which includes an interface assembly provided at the lower portion of the substrate.

DETAILED DESCRIPTION OF THE INVENTION

Figure 2:
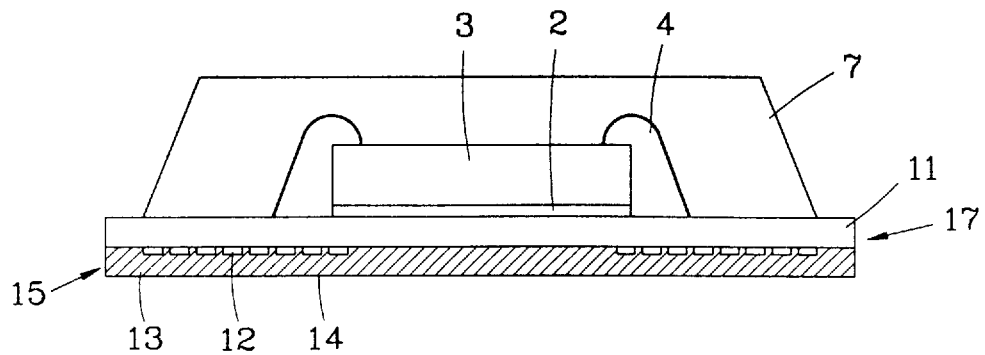
FIG. 2 is a cross-sectional view of a UFBGA package according to the present invention.

FIG. 2 shows a BGA package according to the present invention.

Figure 1:
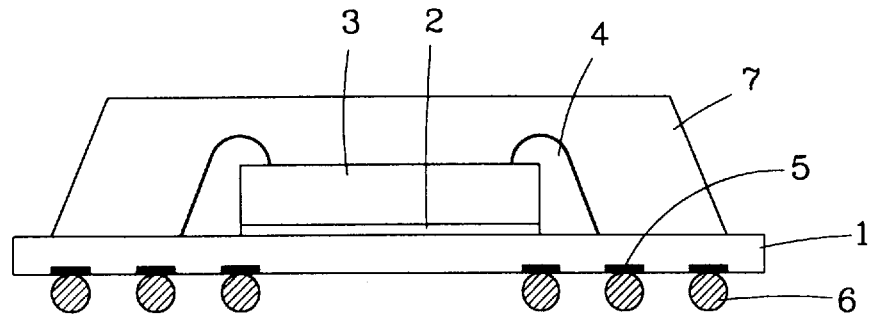
FIG. 1 is a cross-sectional view a conventional BGA package.

As shown therein, a semiconductor chip 3 is bonded to a central portion of a substrate 11 in cooperation with an epoxy adhesive 2. Pads (not shown) of the semiconductor 3 and a conductive pattern (not shown) are electrically connected by a wire 4. In addition, a plurality of spaced-apart electrode protrusions 12 are formed on the lower surface of the substrate 11. That is, the electrode protrusions 12 are formed in this embodiment of the present invention so as to act as the function of the conventional solder balls 6 as shown in FIG. 1.

In more detail, the electrode protrusions 12 are formed at the same portion as the solder balls are bonded in the conventional art.

Meanwhile, an interface assembly 17 is attached to the connection terminal (which is used as the connection terminal of the solder ball 6) of the substrate 11. The interface assembly includes electrode protrusions 12, an anisotropic conductive film 13, and a photosoluble bonding film 14 attached to the lower surface of the anisotropic conductive film 13. In addition, the electrode protrusion 12 has size of below 1 mm. In addition, in this embodiment, only the anisotropic conductive film 13 is used; however, an anisotropic conductive adhesive (not shown) can be used for the same purpose.

The electrode protrusion 12 is coated with either Au or Ag so as to increase electric conductivity and adhesiveness.

Figure 4:
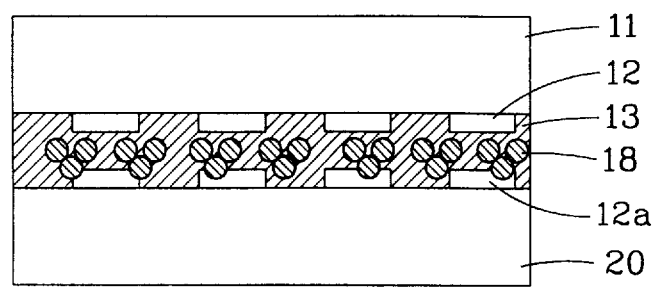
FIG. 4 is an enlarged cross-sectional view of the portion "A" of FIG. 3 according to the present invention.

Meanwhile, the anisotropic conductive film 13 has a thickness of 5–200 $\mu$m, and has a plurality of conductive balls 18 formed therein (refer to FIG. 4)

The photosoluble bonding film 14 is formed with a Norblac/polyester material, and preferably has a thickness of below 200 $\mu$m. When storing the photosoluble bonding film 14, it should be avoided from light, and when it is attached to the printed circuit board 20, it is light-processed.

Figure 3:
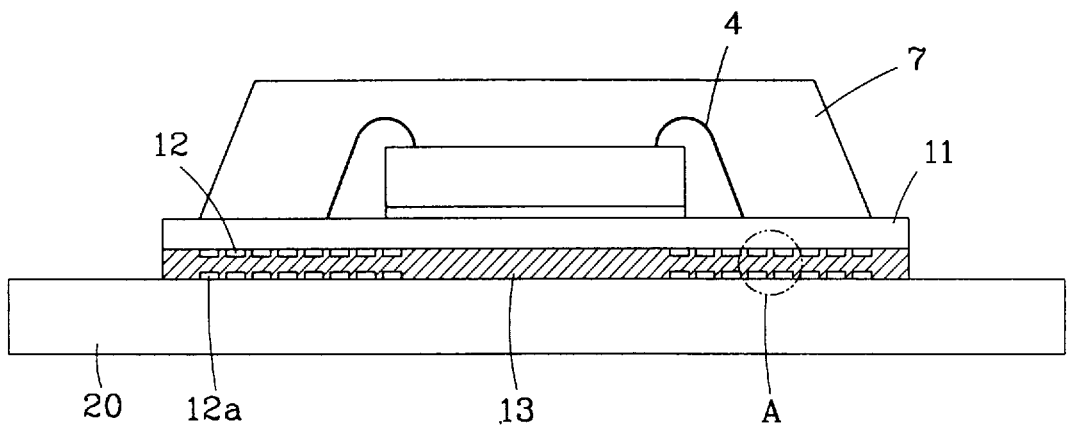
FIG. 3 is a cross-sectional view of a UBGA package bonded to a printed circuit board according to the present invention.

FIG. 3 shows a UBGA package bonded to a printed circuit board according to the present invention.

As shown therein, spaced-apart electrode protrusions 12a are formed on the upper surface of the printed circuit board 20. When attaching the anisotropic film 13 to the printed circuit board 20 as shown in FIG. 2, the photosoluble bonding film 14 is exposed to light, is dry-etched, and mounted on the printed circuit board 20.

Meanwhile, conductive balls 18 are formed within the anisotropic conductive film 13. That is, the electrode protrusions 12 of the substrate 11 and the electrode protrusions 12a of the printed circuit board 20 are aligned to correspond to each other. The anisotropic conductive film 13 is heat-compressed and attached. A plurality of conductive balls 18 are formed within the anisotropic film 13. The conductive balls are mounted at a periphery of the electrode protrusions 12 and 12a.

As described above, the UFBGA package equipped with an interface assembly is directed to reducing the number of processes because the solder balls are not used, so that productivity is increased, and product fabrication cost is decreased.

In addition, because the photosoluble bonding film is provided so as to lengthen the life span of the anisotropic conductive film, at the room temperature, the life span thereof also lengthened.

Although the preferred embodiments of the present invention have been disclosed for illustrative purposes, those skilled in the art will appreciate that various modifications, additions and substitutions are possible, without departing from the scope and spirit of the invention as described in the accompanying claims.

What is claimed is:

1. A ball grid array (BGA) semiconductor package, comprising:

a substrate having an upper surface and a lower surface;

a semiconductor chip attached to the upper surface of the substrate;

a wiring connecting a pad of the semiconductor chip to a conductive pattern on the upper surface of the substrate;

a molding compound molded to the semiconductor chip and the wire;

a plurality of electrode protrusions attached to the lower surface of the substrate; and an interface assembly attached to the lower surface of the substrate, wherein the interface assembly includes an anisotropic conductive film and a photosoluable bonding film.

2. The BGA semiconductor package of claim 1, wherein said plurality of electrode protrusions has a diameter of less than 1 mm.

3. The BGA semiconductor package of claim 1, wherein said plurality of electrode protrusions is coated with at least one of Au and Ag.

4. The BGA semiconductor package of claim 1, wherein said anisotropic conductive film includes a plurality of conductive particles provided therein.

5. The BGA semiconductor package of claim 1, wherein said anisotropic conductive film has a thickness in a range of about 5 to 200 $\mu$m.

6. The BGA semiconductor package of claim 1, wherein said photosoluable bonding film has a thickness less than about 200 $\mu$m.

7. The BGA semiconductor package of claim 1, wherein said semiconductor chip is attached to said substrate by an adhesive.

8. An interface assembly for attaching a chip package to a printed circuit board, comprising:

a plurality of electrode protrusions for attachment to the chip package;

an anisotropic conductive layer having a plurality of conductive particles, corresponding conductive particles being in contact with corresponding electrode protrusions; and a photosoluable layer on said anisotropic conductive layer.

9. The interface assembly of claim 8, wherein each of said plurality of electrode protrusions has a diameter less than 1 mm.

10. The interface assembly of claim 8, wherein said anisotropic conductive layer has a thickness in a range of about 5 to 200 $\mu$m.

11. The interface assembly of claim 8, wherein said photosoluable layer has a thickness less than about 200 $\mu$m.

12. The interface assembly of claim 8, wherein said anisotropic conductive layer is an anisotropic conductive adhesive.

* * * * *